(12) United States Patent
Gates et al.

(10) Patent No.: US 6,737,727 B2
(45) Date of Patent: May 18, 2004

(54) ELECTRONIC STRUCTURES WITH REDUCED CAPACITANCE

(75) Inventors: Stephen McConnell Gates, Ossining, NY (US); Alfred Grill, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/045,711

(22) Filed: Jan. 14, 2002

(65) Prior Publication Data

US 2002/0093075 A1 Jul. 18, 2002

Related U.S. Application Data

(60) Provisional application No. 60/261,292, filed on Jan. 12, 2001.

(51) Int. Cl.[7] .............. H01L 29/00; H01L 29/113; H01L 31/062
(52) U.S. Cl. .............. 257/531; 257/532; 257/536; 257/537
(58) Field of Search ............... 257/530–537

(56) References Cited

U.S. PATENT DOCUMENTS

| | | | |
|---|---|---|---|
| 6,147,009 A | * 11/2000 | Grill et al. | 438/780 |
| 6,486,557 B1 | * 11/2002 | Davis et al. | 257/758 |
| 2001/0045616 A1 | * 11/2001 | Yoshitomi | 257/531 |

* cited by examiner

*Primary Examiner*—Jerome Jackson
*Assistant Examiner*—Jesse A. Fenty
(74) *Attorney, Agent, or Firm*—Scully, Scott, Murphy & Presser; Robert M. Trepp, Esq.

(57) ABSTRACT

An apparatus and method is described incorporating one or more layers of SiCOH and one or more layers of patterned conductors in an integrated circuit chip. The invention overcomes the problem of capacitance by lowering the k of the delectric and overcomes the problem of breakdown voltage and the leakage curent by tailoring the composition of SiCOH.

55 Claims, 14 Drawing Sheets

ELECTRONIC STRUCTURES WITH REDUCED CAPACITANCE

CROSS-REFERENCE TO RELATED APPLICATIONS

This application is cross referenced to Ser. No. 09/796,089 filed Jan. 25, 2001 and assigned to the assignee herein and is directed to specific precursor materials such as cyclic siloxanes or organic molecules containing ring structures to form thermally stable ultralow dielectric constant films such as SiCOH which is incorporated herein by reference.

This application is further cross referenced to Ser. No. 09/938,949 filed Aug. 24, 2001 and assigned to the assignee herein and is directed to specific precursor materials such as cyclic siloxanes or organic molecules containing ring structures and a carrier gas such as $CO_2$ or a mixture of $CO_2$ and $O_2$ to stabilized the plasma in a PECVD to form uniform thermally stable ultralow dielectric constant films such as SiCOH which is incorporated herein by reference.

This application claims benefit of U.S. Provisional Application No. 60/261,292, filed Jan. 12, 2001.

FIELD OF THE INVENTION

This invention relates to passive components integrated on an integrated circuit chip, an integrated circuit carrier, and a circuit board.

This invention also relates to low capacitance multilayer circuit boards, to interconnect structures for high speed microprocessors, to application specific integrated circuits (ASICs), and to other high speed integrated circuits (IC's).

The structures of this invention include a dielectric material having a low dielectric constant, very high breakdown field, and excellent (air barrier) passivation properties.

The invention also describes an improved thin film form of the dielectric material that is useful in some of the inventive electronic structures.

BACKGROUND OF THE INVENTION

Prior art inductor structures used in RF and microwave circuits are commonly isolated from ground using $SiO_2$ which has a dielectric constant (k) of 4 to 4.2. Prior art inductors may be passivated with a polymer dielectric (e.g. Polyimide) which has a dielectric constant (k) or about 2.9.

Prior art transformer structures are commonly isolated internally using $SiO_2$ with a dielectric constant (k) of 4 to 4.2 between adjacent conductors or turns in the winding and between windings.

Prior art multilayer circuit boards commonly are built with a polymer dielectric that absorbs water and has a relatively low breakdown field.

A multilayer circuit board structure is needed with low capacitance between metal layers, such as using a dielectric material with a low dielectric constant, a high breakdown voltage and very low water absorption.

In the prior art, Cu interconnect structures with low-k dielectric are known. An example dual damascene type structure is described in R. Goldblatt et al, "A high performance 0.13 micron Copper BEOL technology with low k dielectric", Proceedings of IITC, 2000. These structures may have high leakage current between the Cu lines, especially as the spacing between the lines is reduced below 180 nm.

Prior art capacitor structures used in RF and microwave circuits are commonly isolated from ground using $SiO_2$ which has a dielectric constant (k) of 4 to 4.2, or another material with still larger k. The capacitors may be passivated with a polymer dielectric (e.g. Polyimide) which has a dielectric constant (k) or about 2.9.

U.S. Pat. No. 6,147,009 by Grill et al. which issued Nov. 14, 2000 entitled "Hydrogenated Oxidized Silicon Carbon Material" describes SiCOH dielectric material and is assigned to the assignee herein which is incorporated herein by reference.

U.S. Pat. No. 6,312,793 by Grill et al. which issued Nov. 6, 2001 describes a multiphase low dielectric constant material and is assigned to the assignee herein which is incorporated herein by reference.

U.S. Pat. No. 5,095,357 by Andoh et al. which issued Mar. 10, 1992 entitled "Inductive Structures For Semiconductor Integrated Circuits" describes inductive structures which is incorporated herein by reference.

U.S. Pat. No. 5,773,870 by Su et al. which issued Jun. 30, 1998 entitled "Membrane Type Integrated Inductor And The Process Thereof" describes and inductor which is incorporated herein by reference.

U.S. Pat. No. 5,793,272 by Burghartz et al. which issued Aug. 11, 1998 entitled "Integrated Circuit Toroidal Inductor" describes both toroidal and spiral inductors which is assigned to the assignee herein and which is incorporated herein by reference.

SUMMARY OF THE INVENTION

The invention provides electronic structures that have superior properties, i.e. reduced parasitic capacitance and improved reliability. The structures of this invention contain a dielectric material "SiCOH" having a low dielectric constant, very low leakage current, high breakdown field, and excellent passivation (air barrier) properties.

Various inductive and capacitive structures with superior electrical performance are disclosed. All of the structures have reduced parasitic capacitance (reduced capacitive coupling to a supporting substrate), compared to prior art structures using existing dielectrics. Reduced parasitic capacitance (reduced capacitive coupling to a substrate) results in Lower Power consumption and higher frequency performance.

Included are inductors having reduced capacitance both within the inductive device and parasitic capacitance between the device and ground, transformers having reduced capacitance within the device, low capacitance circuit boards, and reliable capacitors having a low capacitance.

The invention provides a spiral, toroidal or membrane inductor having a low capacitance within the inductive structure, and a low capacitance between the inductor and ground. In addition, these inductors must be reliable for long life in integrated circuits such as in mobile applications. These properties are obtained in an inductor structure containing SiCOH dielectric material having a low dielectric constant, a high breakdown voltage, a low leakage current, and low oxygen and water permeation to isolate the inductor from the substrate.

The invention provides a transformer having a low internal capacitance between two conductive windings. Also, the transformer should have a low capacitance to the substrate or ground. In addition, the transformer must be reliable. These properties are obtained in a transformer containing a layer of SiCOH dielectric material between the 2 windings. Said SiCOH dielectric has a low dielectric constant, a high breakdown voltage, a low leakage current, and low oxygen and water permeation.

An improved low-k dielectric plus Cu interconnect structure (such as dual damascene type) for high speed microprocessors and ASIC's according to the invention is also described.

The invention provides a low-k Cu interconnect structure with a dielectric having a low dielectric constant (k) and simultaneously a low leakage current between Cu lines where the lines are spaced less than 180 nm apart.

It is an object of this invention to provide reliable capacitors (with a low, stable capacitance), inductors having reduced capacitance within the inductive device and a reduced parasitic capacitance between the device and ground, low capacitance circuit boards, and an improved low-k dielectric plus Cu interconnect structure (such as dual damascene type).

The invention provides an interdigital capacitor having a low parasitic capacitance and excellent reliability. This is obtained in a capacitor structure in which the SiCOH dielectric material has a low dielectric constant, a high breakdown voltage, a low leakage current, and low oxygen and water permeation, is used to isolate the structure from the substrate.

It is another object of this invention to utilize a dielectric material comprised of Si, C, O, and H (called "SiCOH") which has a dielectric constant of less than 3.5 and a high breakdown field, greater than 4.5 MV/cm, and a low leakage current in the inventive structures. A low leakage current is defined here as approximately less than 10 nAmp/cm2 at an applied field of 1 MV/cm. Further, this material is a reliable barrier to O2 and H2O permeation.

This invention improves on prior art structures by reducing the parasitic capacitance of the structures.

The integrated devices also have excellent electrical isolation (low leakage).

Both of these reduce the power consumption of the structures.

As described herein, the SiCOH dielectric material (also called "carbon-doped oxide") exhibits a very high breakdown voltage, from 4.5 to 10 MV/cm, and a low leakage current and dielectric constant less than 3.5 when prepared according to the procedures described here and when the material has the atomic composition specified herein.

BRIEF DESCRIPTION OF THE DRAWING

These and other features, objects, and advantages of the present invention will become apparent upon consideration of the following detailed description of the invention when read in conjunction with the drawing in which.

DETAILED DESCRIPTION OF THE PREFERRED AND ALTERNATE EMBODIMENTS

In an RF or microwave circuit, an inductor is commonly needed. Power consumption through current leakage from the inductor to the substrate should be minimized to use the circuit in a mobile phone or other mobile battery powered device. Parasitic capacitance between the inductor and the substrate is also a problem, and this capacitance is worse at higher frequencies. Commonly, the maximum operating frequency of an inductor is limited by parasitic capacitance.

EXAMPLE 1

FIG. 1 is a schematic drawing of the spiral inductor structure of this invention. FIG. 1A is a top view showing the layout of said inductor. FIG. 1B is a section view through Plane B, showing the layers of said inductor in cross-section. FIG. 1C is a schematic circuit diagram to illustrate the use of the structure of FIGS. 1A and 1B in an RF or microwave circuit.

Referring to FIG. 1, substrate 1 contains a layer of patterned conductor formed within dielectric layer 2. One of the conductors, 3, is shown. On the patterned conductors is a layer of the SiCOH dielectric, 4. One via contact to the inductor, 6, is located within the SiCOH dielectric layer. Atop the SiCOH dielectric layer is a spiral inductor structure, 5, consisting of concentric windings 7 and 8. At the opposite side of the inductor, the same windings are labelled 9 and 10. Surrounding the inductor structure is a protective (passivation) layer of the SiCOH dielectric, 11. The SiCOH dielectric layer serves to isolate the inductor structure from the substrate, providing a low dielectric constant and low leakage isolation.

Figure 1A:
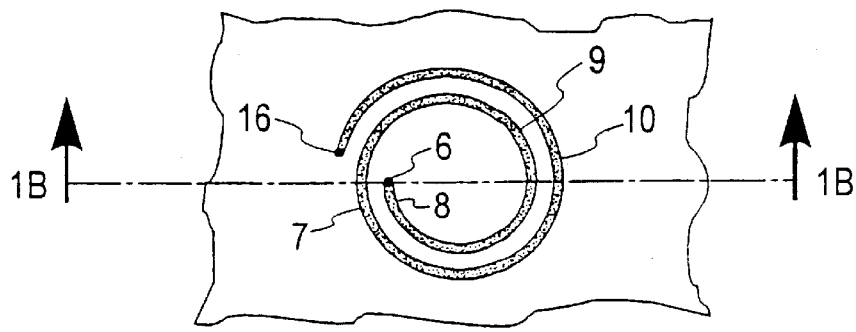
FIG. 1A is a top view of one embodiment of the invention showing a spiral inductor.
Figure 1B:
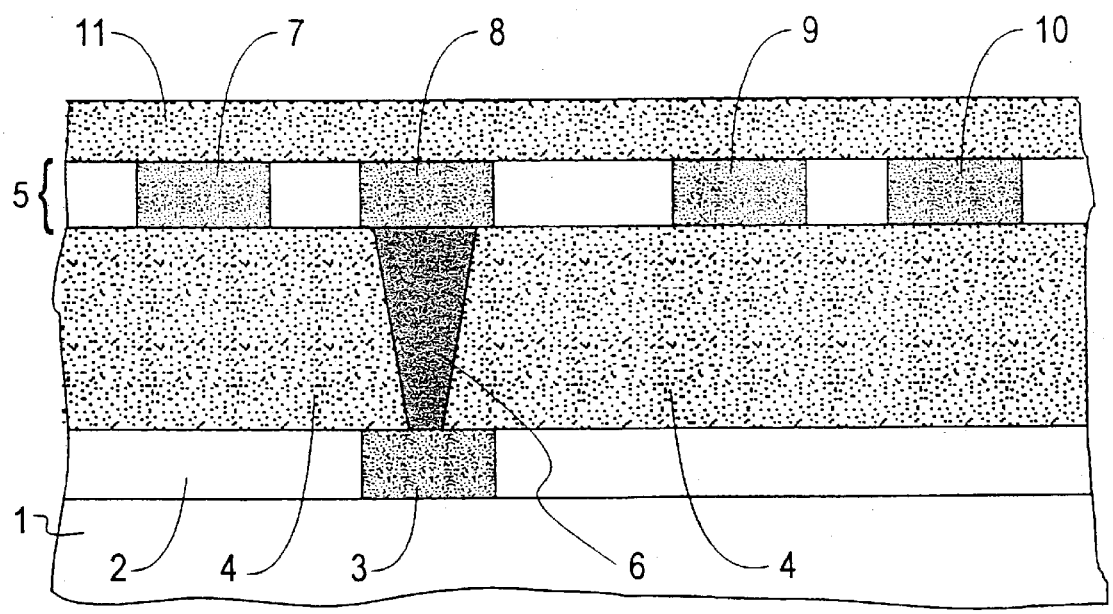
FIG. 1B is a cross section view along the lines 1B—1B of FIG. 1A.
Figure 1C:
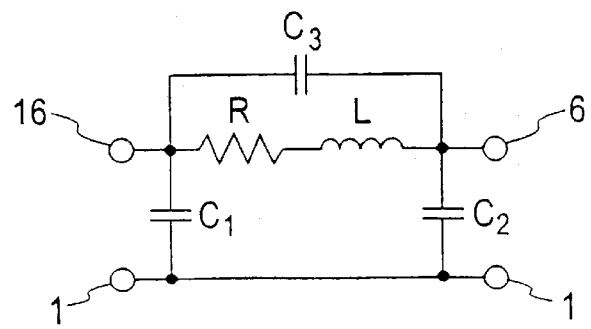
FIG. 1C is a schematic circuit of an electrical model of the inductor shown in FIG. 1.
Figure 1D:
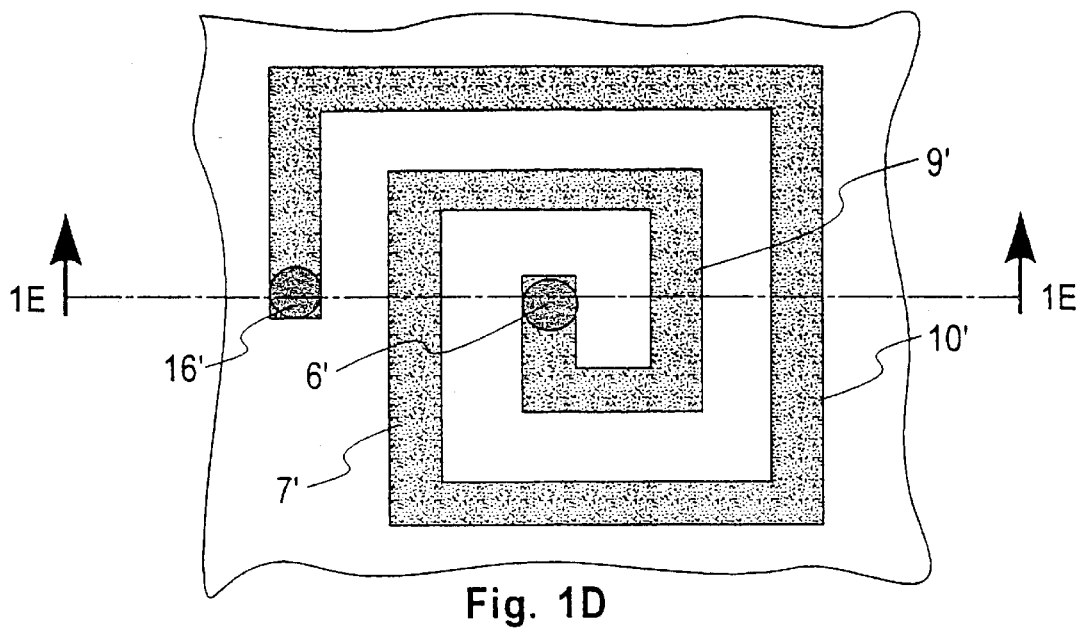
FIG. 1D is a top view of an alternated embodiment of the invention showing a rectangular spiral inductor.
Figure 1E:
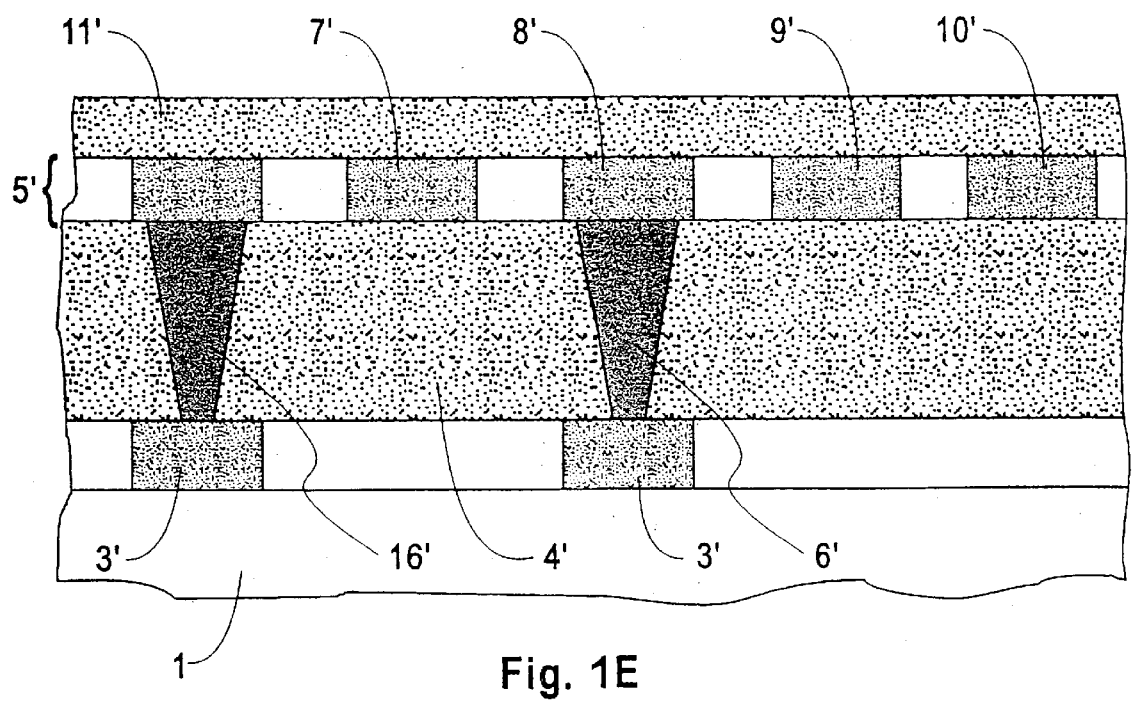
FIG. 1E is a cross section view along the lines 1E—1E of FIG. 1D.

Referring to FIG. 1C, the C1 and C2 parasitic capacitances are made as small as possible through the use of SiCOH dielectric as layer 4. The internal capacitance, C3, of the inductor is made as small as possible through the use of SiCOH dielectric as layer 11.

Figure 2A:
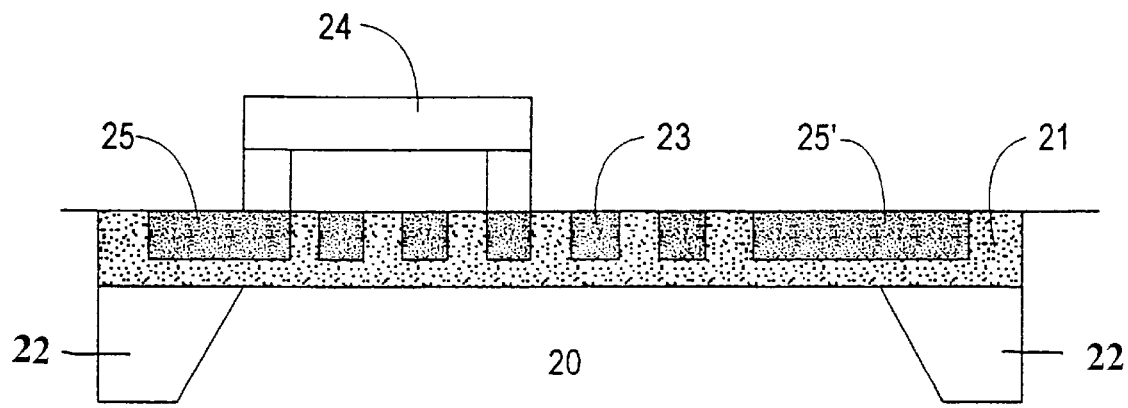
FIG. 2A is a cross section view along the lines 2A—2A of FIG. 2C showing a membrane inductor structure of this invention.
Figure 2B:
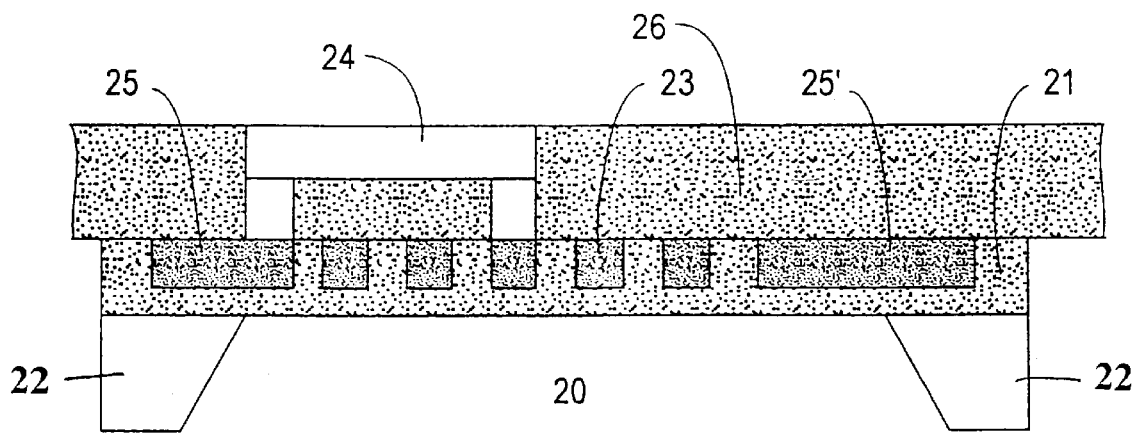
FIG. 2B is a cross section view as shown in FIG. 2A with an interconnection layer added on top.
Figure 2C:
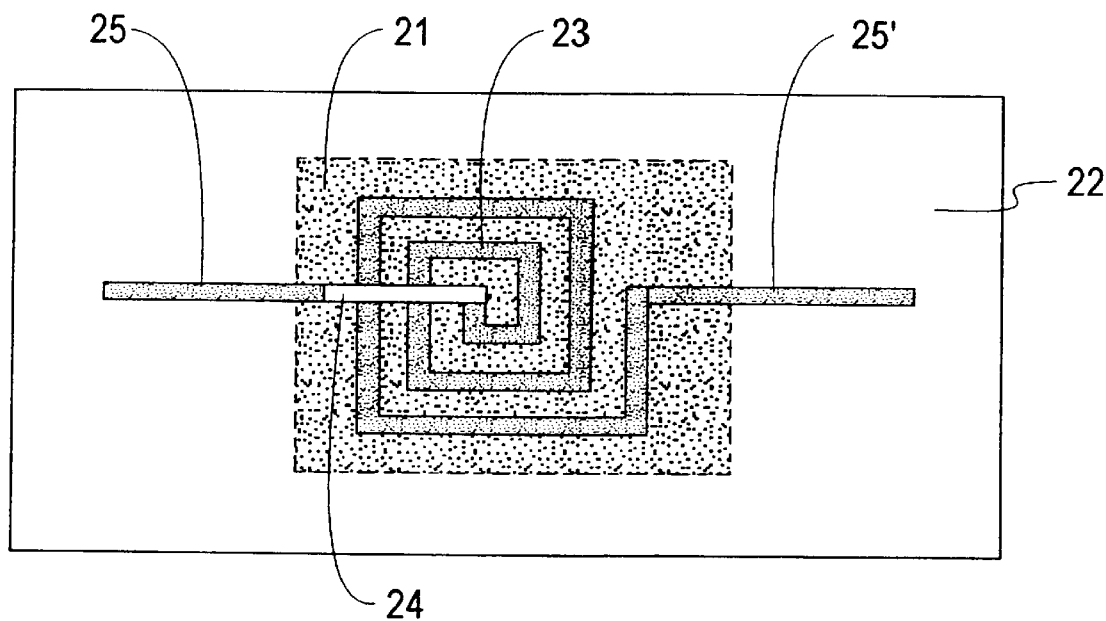
FIG. 2C is a top view of a membrane inductor.

As would be known by one skilled in the art, an alternative shape of the inductor may be used in the inventive structure, including a toroidal shape or the type of shape shown in FIG. 2.

Desired Material Properties

The SiCOH dielectric layers, 4 and 11, in FIG. 1B has the preferred atomic composition Range H 30–35%, C 12–18%, Si 18–22%, O 30–35%, and more generally the composition range may be H 25–55%, C 10–40%, Si 10–25%, O 10–25%.

The SiCOH dielectric of the present invention includes the precursors described in U.S. Pat. No. 6,147,009 and trimethylsilane or tetramethylsilane and an oxidizing precursor, for example $O_2$, $N_2O$, $CO_2$, etc. and also includes other organosilane precursors.

This film is typically 0.5 micron or greater in thickness, and has a measured current versus electric field curve similar to that shown in FIG. 8 below, and has a breakdown field of greater than 4.5 MV/cm, and a dielectric constant of less than 3.5, and commonly less than 3. Optionally, the composition is not uniform throughout the film thickness.

For example, a "graded" composition may be to create a dense region containing less H and C at the outer film surface to form a non-permeable barrier region. A second example is to improve adhesion at an interface by changing the composition at that interface.

Optionally, the film is formed in a multilayer (nanolaminate) form with sub-layers in the thin film, for example 3 sub-layers.

EXAMPLE 2

See U.S. Pat. No. 5,773,870 in which claim 2 lists membrane materials, and does not include SiCOH in the list.

Previous inductors located on a free-standing membrane (See U.S. Pat. No. 5,773,870) have used materials having a dielectric constant to form the membrane. Some of these materials are semiconducting.

FIG. 2 is a schematic drawing of the membrane inductor structure of this invention, in which a membrane is made of the SiCOH dielectric, which has both a low dielectric constant and excellent insulator properties.

FIG. 2A is a section view of said inductor with 1 dielectric layer as the supporting membrane under the inductor.

Referring to FIG. 2, a layer of the SiCOH dielectric, 21, has been formed as a membrane by removing a sacrificial material (not shown). Regions of the substrate, 22, remain supporting the membrane.

Located atop the SiCOH membrane are conductors, 25 and 25', to connect the inductor. Within the structure are windings, 23. Over the inductor structure a layer of the SiCOH dielectric, 26, has been deposited to protect and passivate the structure. The conductor layer 24 is atop the passivation layer, 26, making electrical contact to one end of the windings.

Referring to the simple circuit diagram, FIG. 1C, the C1 and C2 parasitic capacitances are minimized through the use of SiCOH dielectric membrane, 21, supported over an air gap 20. The internal capacitance, C3, of the inductor is made as small as possible through the use of SiCOH dielectric as layer 26, which protects the structure.

As would be known by one skilled in the art, an alternative shape of the inductor may be used in the inventive structure, including a torroidal shape or the spiral shape shown in FIG. 1.

The SiCOH dielectric layers, 21 and 26, In FIG. 2 have the same characterisitics and composition described above in reference to Example 1.

EXAMPLE 3

Transformer structures integrated on an IC, or on an IC carrier ("flip-chip") are commonly useful. Capacitive coupling within the transformer (between the windings) consumes power and limits the frequency of operation. A low capacitive coupling between the windings would be desirable, for example a dielectric material with low dielectric constant (low k). Commonly, the dielectric between the 2 windings of the transformer may undergo dielectric breakdown. A transformer dielectric with low k and with a high breakdown voltage would be desirable.

Figure 3A:
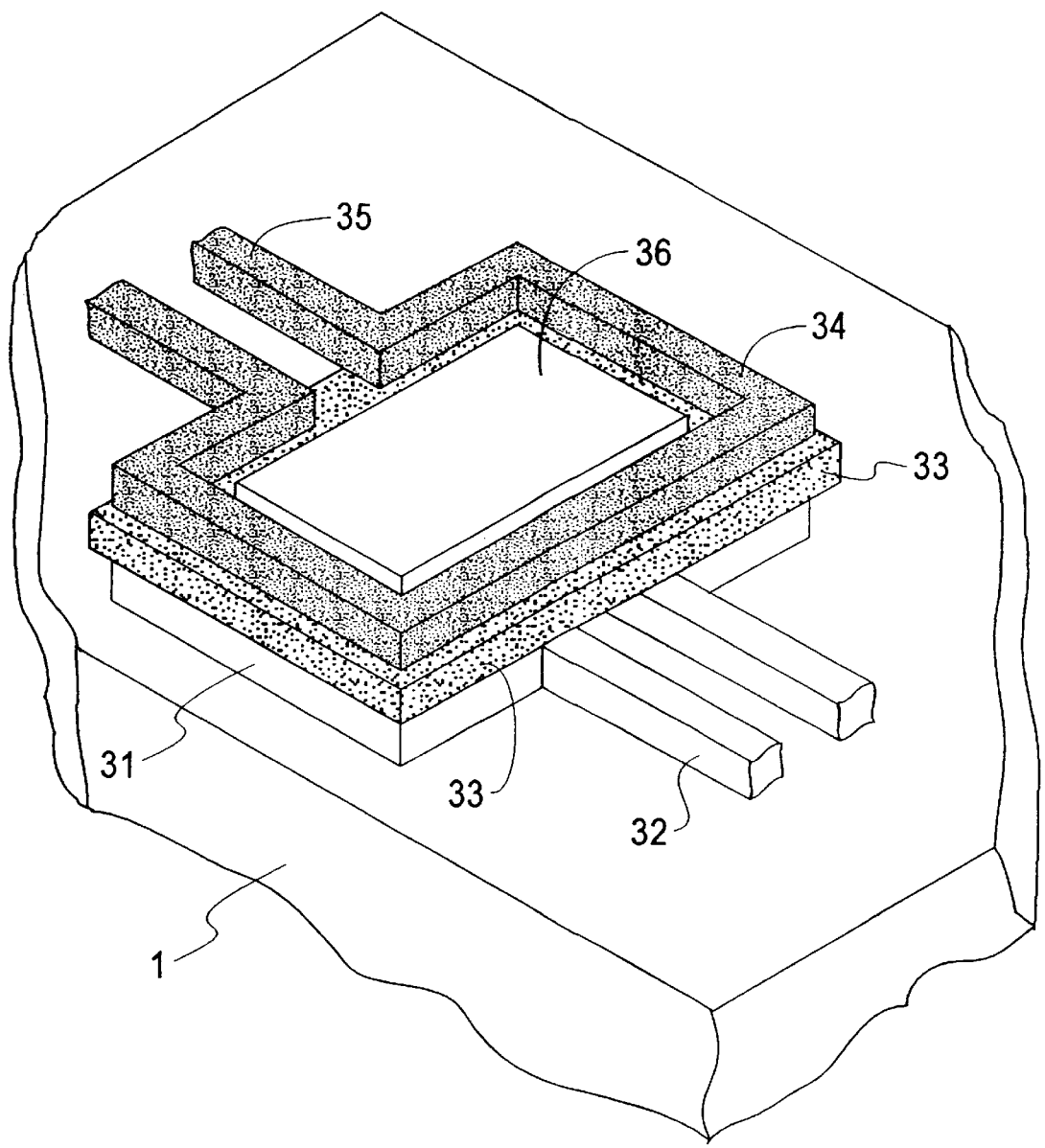
FIG. 3A is a perspective view of a transformer.

FIG. 3A shows a perspective view of a transformer structure according to the invention.

Figure 3B:
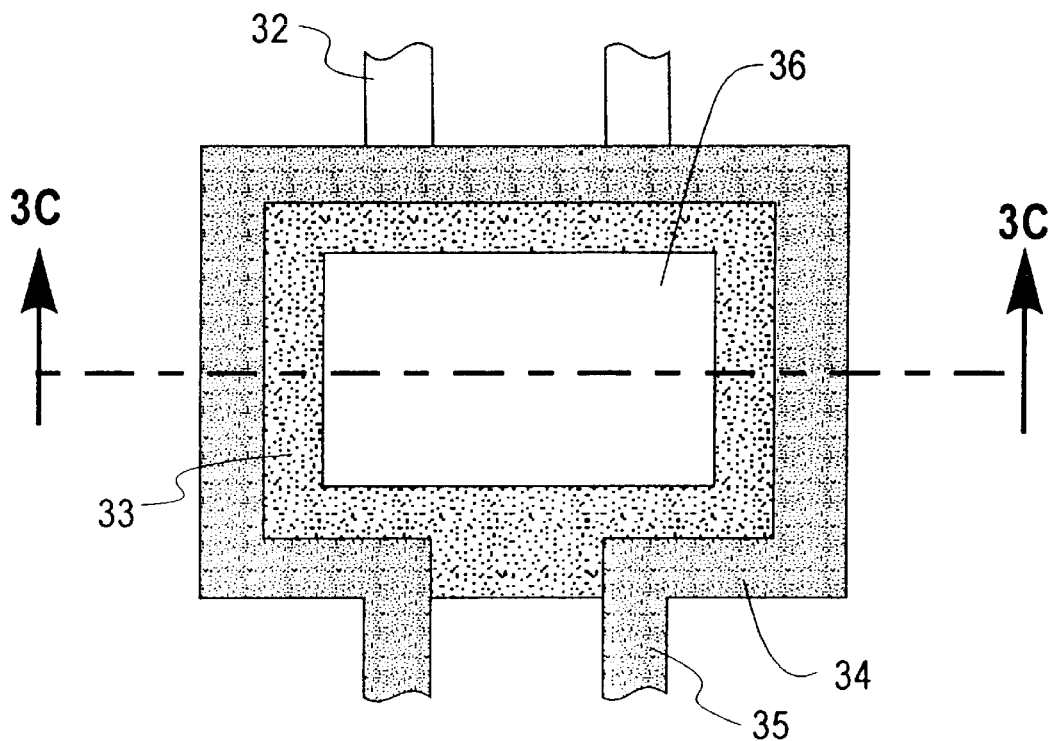
FIG. 3B is a top view of FIG. 3C of a transformer structure of this invention.
Figure 3C:
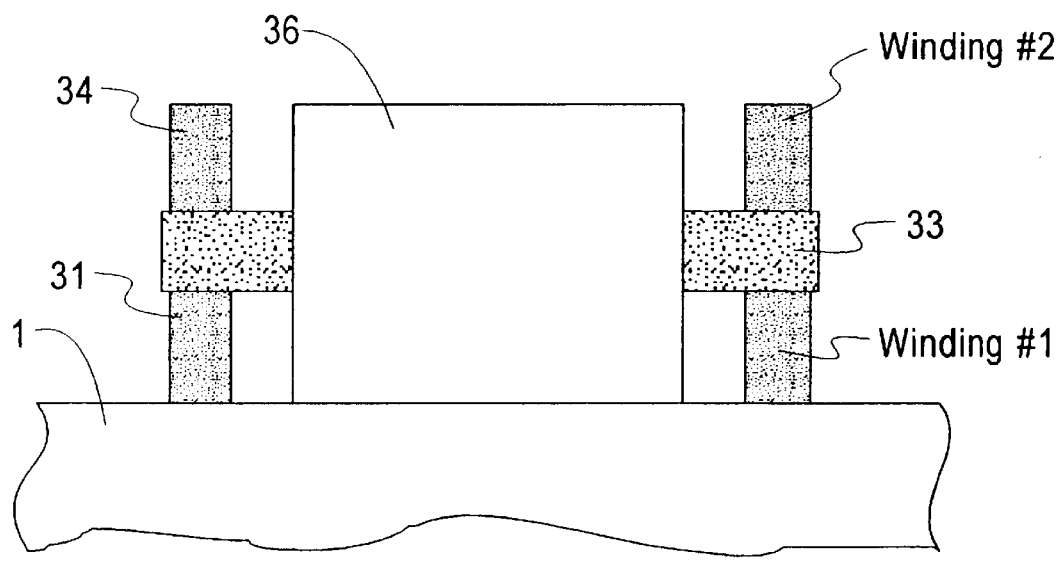
FIG. 3C is a cross section view along the lines 3C—3C of FIG. 3B.

FIG. 3B is a top view, and FIG. 3C is a section view. Referring to FIG. 3B, a top winding, 34 is patterned in a convenient closed loop shape. Conductor regions 35 carry current to said top winding. A layer of SiCOH dielectric, 33, is underneath said top winding. Conductor regions 32 carry current to a lower winding 31 shown in FIG. 3C. A magnetic material 36 which may be permanent magnetic material is located within the closed loop of said top winding and said lower winding.

FIG. 3C is a cross section view through along the lines 3C—3C of FIG. 3B. Atop substrate 1, is located a lower winding, 31. The SiCOH dielectric, 33, is seen in cross section between patterned conductors 31 and 34.

Optionally, the transformer structure of this invention may contain a discontinuous layer of SiCOH dielectric underneath the upper winding 34, so that said upper winding is supported in regions by said layer of SiCOH dielectric, and in other regions is not supported such as by an air bridge or air gaps.

The SiCOH dielectric layer, 33, in FIG. 3 has the same characterisitics and composition described above in reference to Example 1.

EXAMPLE 4

Figure 4:
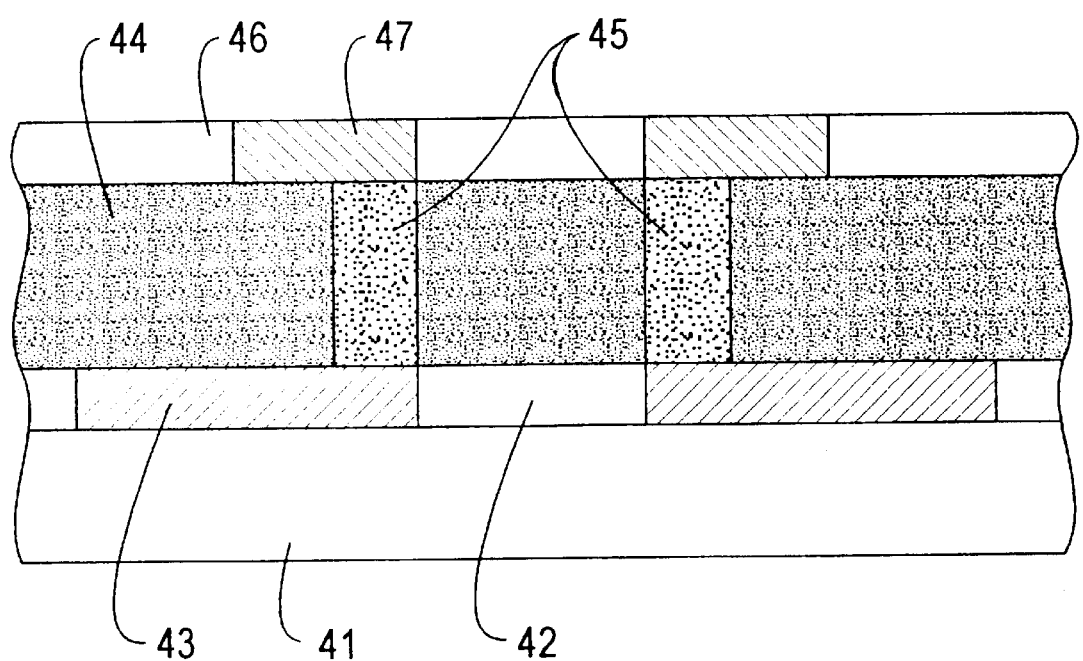
FIG. 4 is a cross section view of the first multilayer circuit board structure of this invention.

FIG. 4 is a cross section view showing the layers of the first circuit board substructure of this invention, using a thick film of the SiCOH material.

Referring to FIG. 4, an insulating substrate, 41, supports a first conductor layer that is patterned to form a plurality of first conductors, 43. Separating said plurality of first conductors, 43, is a dielectric, 42. Atop said layers is a SiCOH dielectric layer, 44, seen in cross section. Atop said SiCOH layer is a second conductor layer that is patterned to form a plurality of second conductors, 47. Separating said plurality of second conductors, 47, is a dielectric, 46. Within said SiCOH layer is a plurality of connectors (vias), 45, making selected electrical contact between conductors 43 and 47.

A multilayer circuit board structure according to the invention may contain one substructure or a plurality of substructures, meaning the substructure of FIG. 4 may be repeated to form a multilayer circuit board structure.

The SiCOH dielectric layer, 44, in FIG. 4 has the same characterisitics and composition described above in reference to Example 1.

EXAMPLE 5

Figure 5:
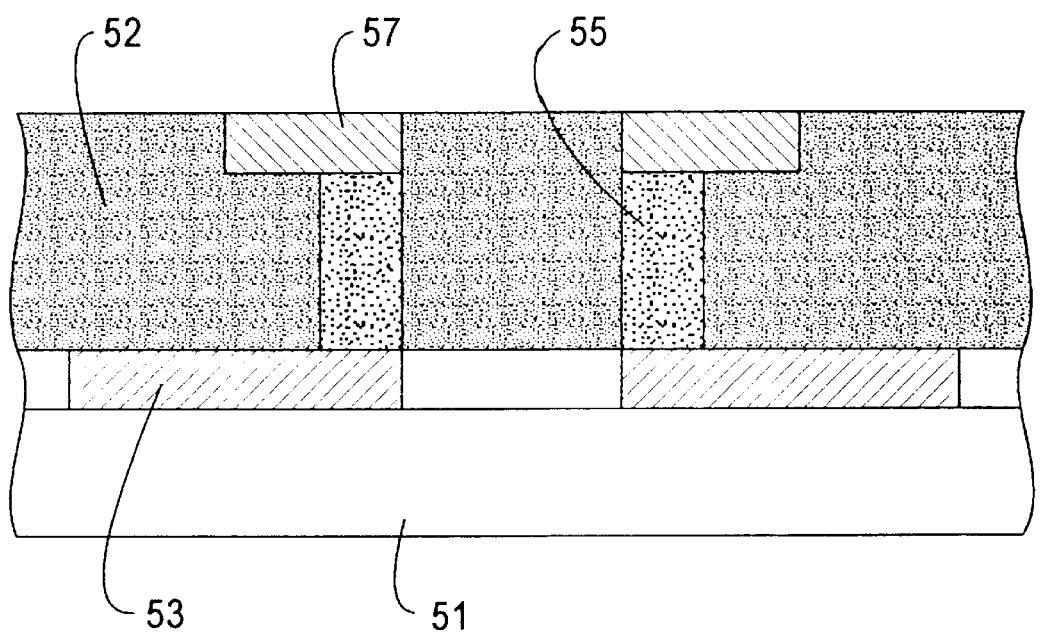
FIG. 5 is a cross section view of a first multilayer circuit board structure of this invention.

FIG. 5 is a cross section view showing the layers of the second circuit board substructure of this invention, using a thick film of the SiCOH material.

Referring to FIG. 5, an insulating substrate, 51, supports a first conductor layer that is patterned to form a plurality of first conductors, 53. Atop said conductor layer, and surrounding said conductor layer is a SiCOH dielectric layer, 52, seen in cross section. Within said SiCOH layer is a second conductor layer that is patterned to form a plurality of second conductors, 57. Within said SiCOH layer is a plurality of connectors (vias), 55, making selected electrical contact between conductors 53 and 57.

A multilayer circuit board structure according to the invention may contain one substructure or a plurality of substructures, meaning the substructure of FIG. 5 may be repeated to form a multilayer circuit board structure.

The SiCOH dielectric layer, 52, in FIG. 5 has the same characterisitics and composition described above in reference to Example 1.

EXAMPLE 6

Figure 6:
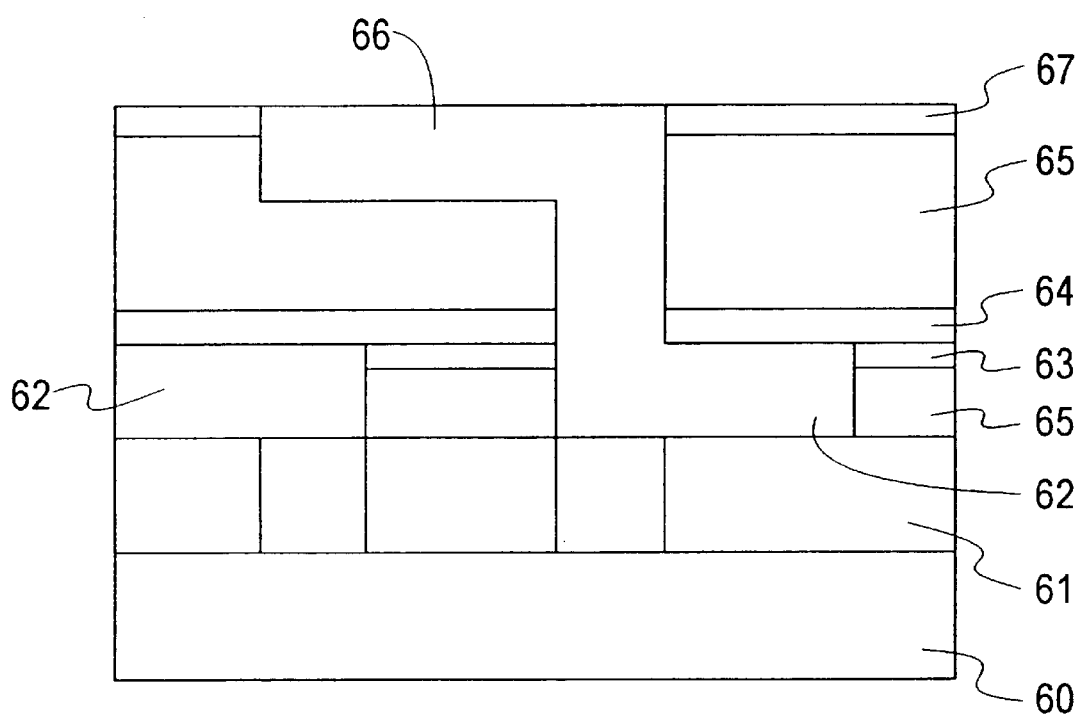
FIG. 6 is a cross section view of a low-k interconnect structure of the dual damascene type of this invention.

FIG. 6 is a section view showing the layers of the low-k interconnect structure of the dual damascene type, of this invention made in a polymeric organic thermoset dielectric and using the SiCOH dielectric material formed as a thin film (thickness>about 30–50 nm, and less than 100 nm.). As a hardmask patterning/CMP-stop layer.

Referring to FIG. 6, on a substrate 32 are deposited patterned metal conductors 40 and 50 are formed within a low-k dielectric, 44 and 38. Atop the dielectric 38 is a masking/cmp-stop layer, 72. In the preferred structure, said masking/cmp-stop layer, 72 is comprised of the thin film form of the SiCOH dielectric having thickness from 20–100 nm, and preferably 30–60 nm. Atop the masking/cmp-stop layer, 72, and the metal conductors, 40, is the "post-CMP Cap" layer, 62. In the preferred structure, said post-CMP Cap layer is an amorphous alloy of Si, C, H or Si, N, C, H.

The SiCOH dielectric layer 72, in FIG. 6 has the preferred atomic composition H 30–35%, C 13–17%, Si 20–26%, O 25–32%. At this composition, and in the 20–100 nm range of thickness, the measured current versus electric field curve is similar to that shown in FIG. 9 below, and a breakdown field of greater than 6 MV/cm is measured (see FIG. 9), and a dielectric constant of less than 3.5. More generally, the composition may be H 25–55%, C 10–40%, Si 10–30%, O 10–35%. Optionally, the composition is not uniform throughout the film thickness, and a "graded" composition is used for example to improve adhesion at an interface.

Optionally, the film is formed in a multilayer (nanolaminate) form with sub-layers in the thin film, for example 3 sub-layers.

EXAMPLE 7

A stable RC time constant for an RF or microwave circuit is commonly required so the circuit has a stable operating frequency over several years of use. In these wireless circuits, a capacitor having a stable fixed capacitance with a minimum of (parasitic) capacitive coupling to the substrate is needed. FIG. 7 contains schematic drawings of the capacitor structures of this invention, said structures containing SiCOH dielectric layers for: 1) isolation from the substrate, and 2) protection (passivation) against air oxidation. (Not for the capacitor dielectric)

Figure 7A:
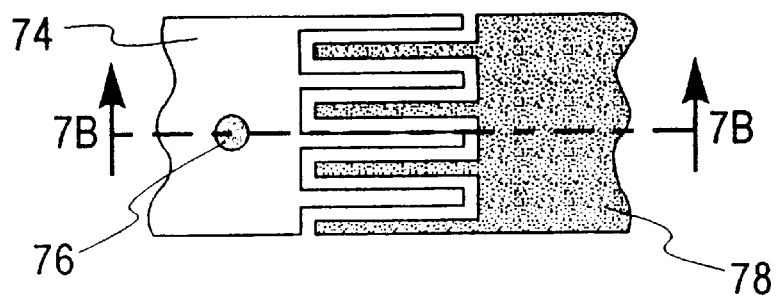
FIG. 7A is a top view of an interdigital capacitor structure of this invention.
Figure 7B:
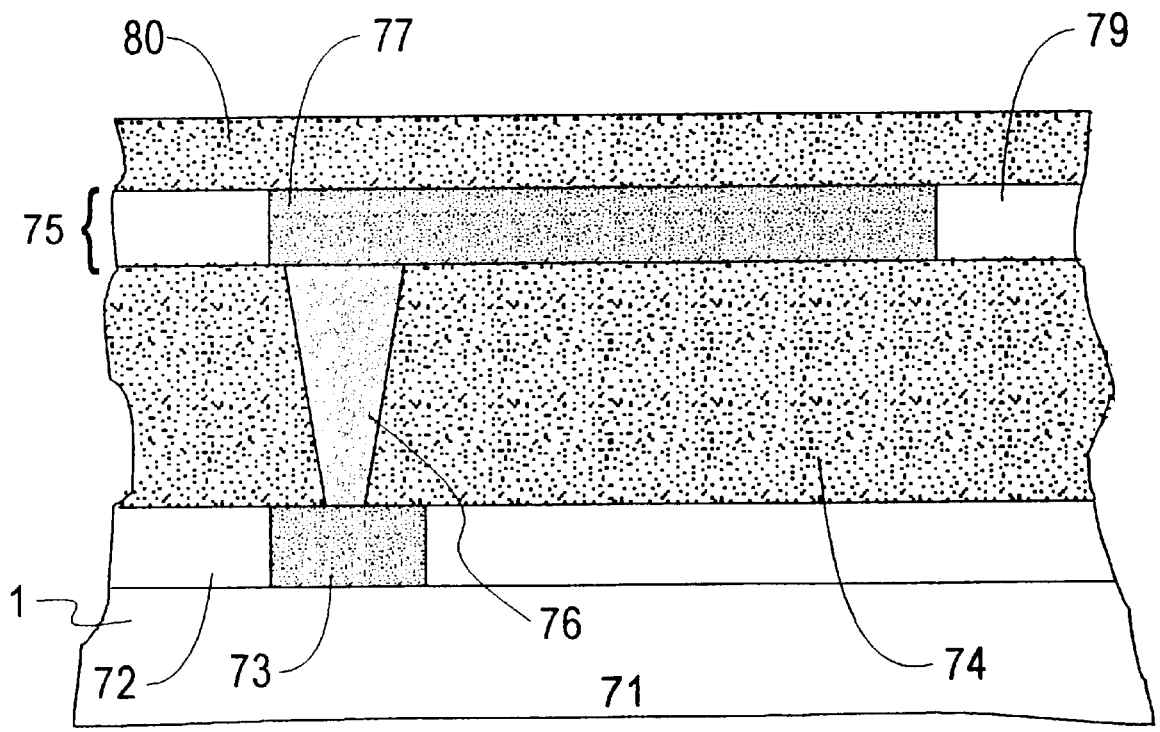
FIG. 7B is a cross section view along the lines 7B—7B of FIG. 7A.
Figure 7C:
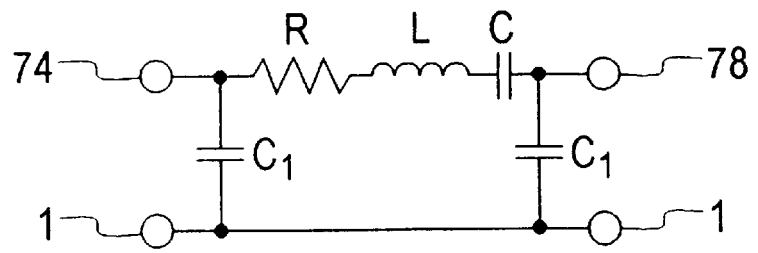
FIG. 7C is a schematic circuit of an electrical model of the capacitor shown in FIGS. 7A and 7B where $C_1$ is reduced due to use of the low k dielectric.
Figure 7D:
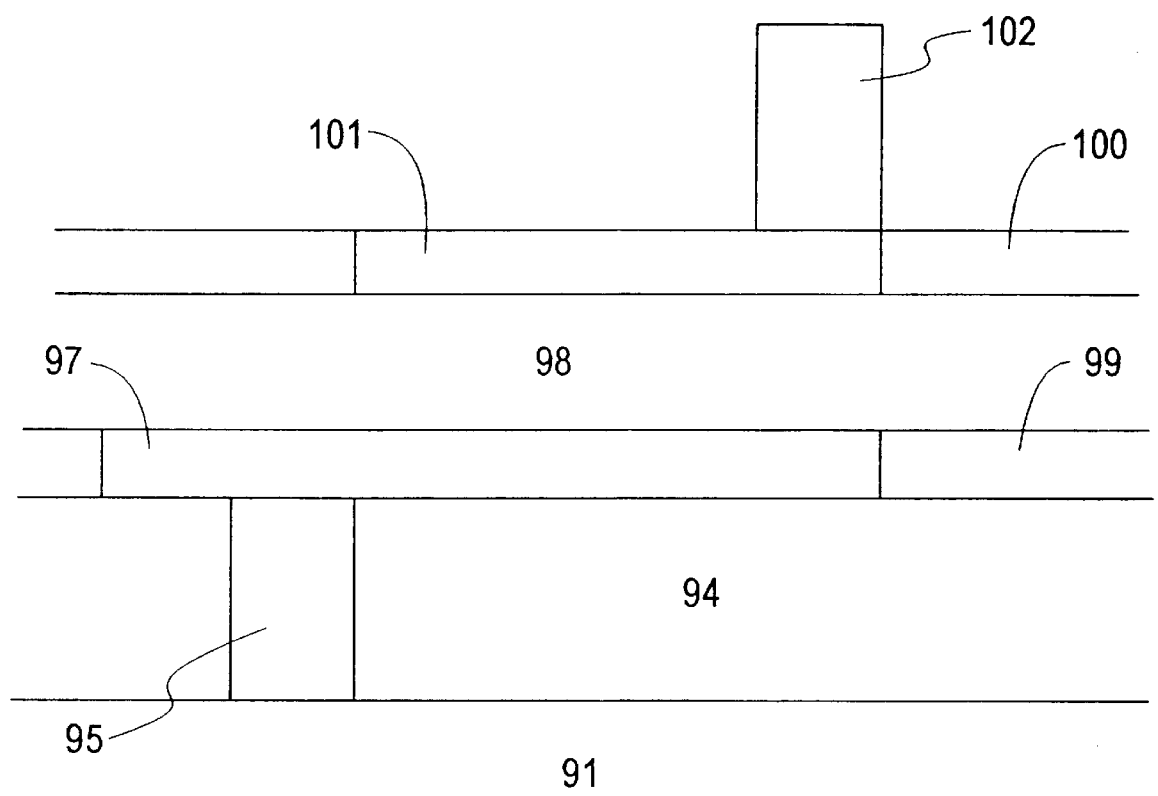
FIG. 7D is a cross section view of an alternate embodiment showing a parallel plate capacitor.

FIG. 7A is a top view of an interdigital capacitor according to this invention. The interdigital structure is one example layout of a capacitor according to the invention. FIG. 7B is a section view showing the layers of said capacitor in cross-section. FIG. 7C is a schematic circuit diagram to illustrate the use of the capacitor of FIGS. 7A and 7B in an RF or microwave circuit. FIG. 7D is a section view showing the layers of a parallel plate capacitor according to the invention.

Referring to FIG. 7A, which is a top view, a capacitor structure, 75, contains a conductor layer that is patterned into 2 electrodes, 77 and 78, which electrodes are shown with an interdigitated structure to increase the capacitor area. Other structures for the 2 electrodes are also possible within this invention. A via contact, 76, to one of the electrodes is shown. FIG. 7B is a section view of said capacitor in which a substrate, 71, contains a dielectric layer 72 and a lower conductor, 73, within said dielectric. A layer of the SiCOH dielectric, 74, is atop the conductor layer. Layer 74 provides low capacitance isolation from the substrate. A single via contact, 76, passes through the SiCOH dielectric and makes contact to the 1st electrode, 77. (The second electrode and a second via contact to said electrode are not shown in the section view of 7B.) Preferably, the electrodes are made by a damascene process within the capacitor dielectric, 79. A layer of the SiCOH dielectric, 80, may optionally be located atop the capacitor structure to provide protection (passivation) against air oxidation.

FIG. 7C is a schematic circuit diagram, in which the parasitic capacitance between the structure 75 and the substrate 71 is shown as C1. C1 is reduced to a minimum value by a low k dielectric (SiCOH) as layer 74. The R, L, and C of FIG. 7C are the resistance, inductance and capacitance, respectively, of the structure shown in FIGS. 7A and 7B.

An alternative capacitor of this invention is shown in cross-section in FIG. 7D, a parallel plate type capacitor. Referring to FIG. 7D, a substrate, 91, contains a layer of the SiCOH dielectric, 94, atop the substrate. Layer 94 provides low capacitance isolation from the substrate. A single via contact, 96, passes through the SiCOH dielectric and makes contact to the 1st electrode, 97, which is formed within a dielectric layer 99. The capacitor dielectric, 98, may be a high k metal oxide ($Ta_2O_5$, $Al_2O_3$, etc.), or silicon nitride, or another dielectric. The second electrode 101 and a via, 102, contacting said electrode are shown. The second electrode is formed within a dielectric layer 100.

C1 represents the parasitic capacitance between the capacitor structure and the substrate 91, and C1 is reduced to a minimum value by a low k dielectric (SiCOH) as layer 94.

The SiCOH dielectric layer, 94, has the same characterisitics and composition described above in reference to Example 1.

Figure 8:
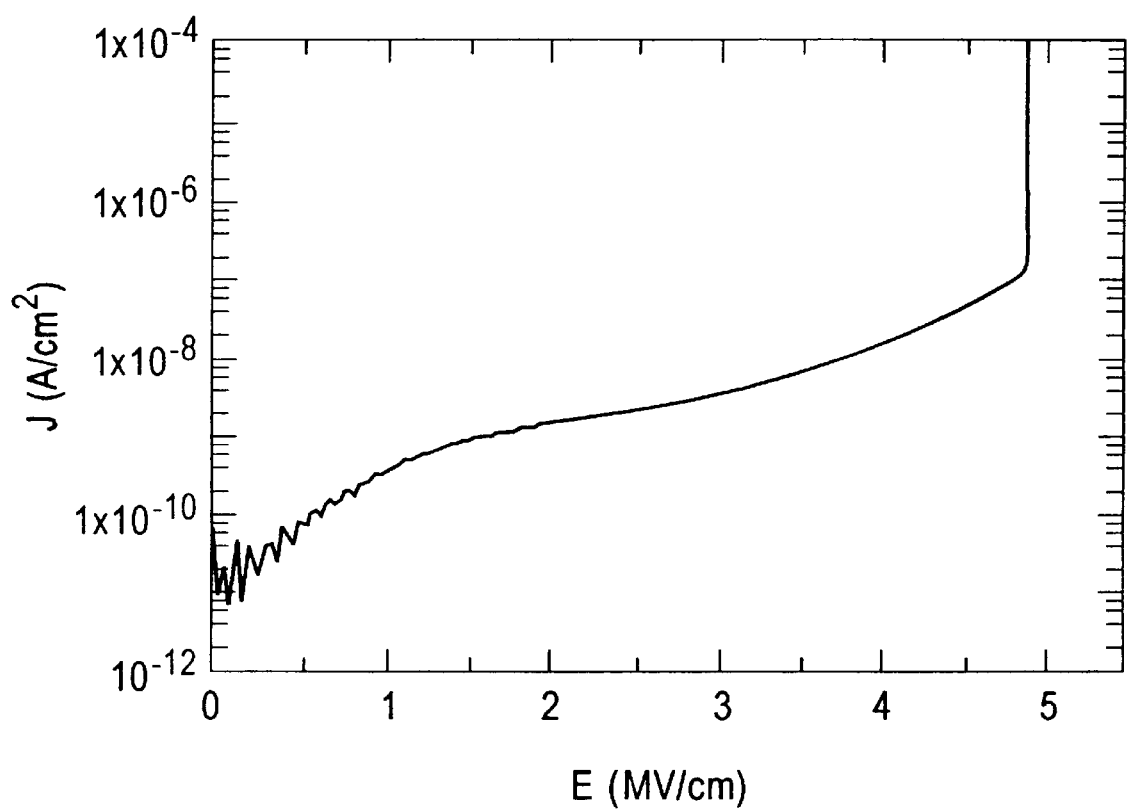
FIG. 8 is a graph of the current per unit area versus electric field of the thick film SiCOH dielectric material of this invention.

FIG. 8 is a current vs. Field plot of the thick film SiCOH dielectric material of this invention. Dielectric breakdown, 105, is seen at an applied field, E, of between 4.5 and 5 MV/cm. The leakage current, 106, at 1 MV/cm applied field is less than 1 nanoAmp/cm2.

FIG. 8 shows this material is an exceptionally stable dielectric having superior properties compared to other Low-k dielectrics. The high breakdown field and low leakage current and low dielectric constant are not expected, based on other Low-k dielectrics. These properties make the SiCOH dielectric film of FIG. 8 especially suited as an isolation dielectric for use in many electronic structures. For example, inductors, capacitors and resistors may all be isolated from a substrate using this material, with new and unexpected gains in high frequency performance.

Figure 9A:
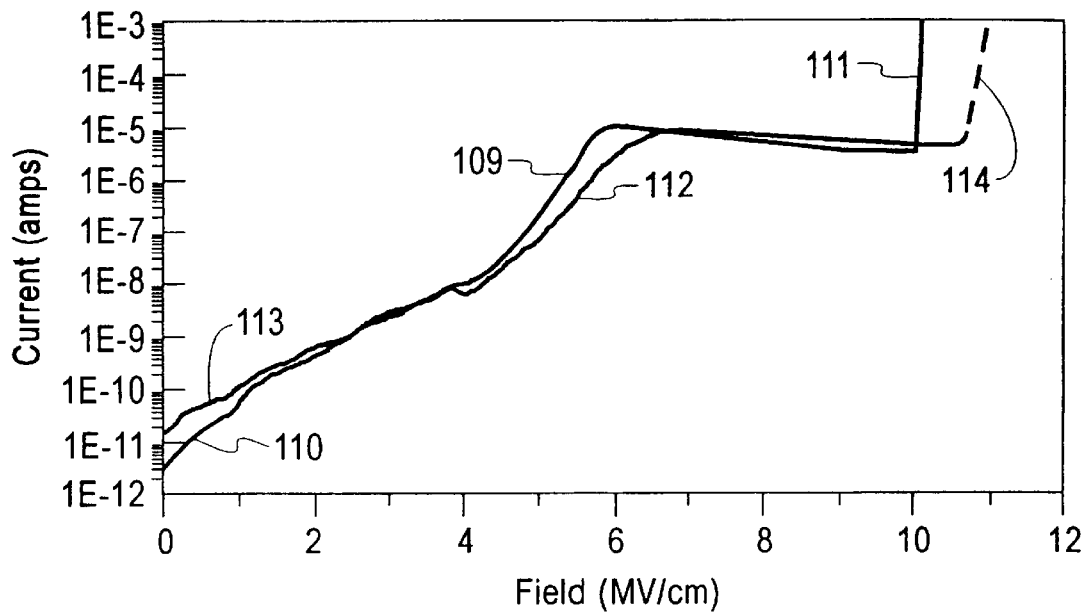
FIG. 9A is a graph of the current per unit area versus field of the thin film SiCOH dielectric material of this invention.
Figure 9B:
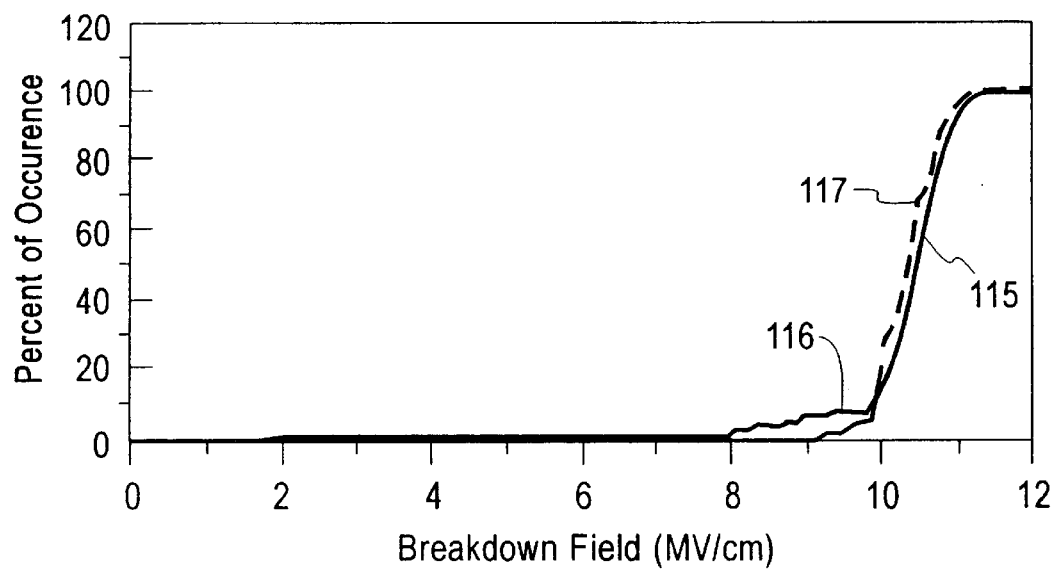
FIG. 9B is a graph of the percent of occurrence of breakdown versus breakdown electric field of the thin film SiCOH dielectric material of this invention.

FIG. 9A is a current versus electric field plot for the thin film SiCOH dielectric material of this invention. FIG. 9B is a plot of the % of capacitors having a specific Breakdown Field plotted versus said field, so is a Breakdown distribution plot, for the thin film SiCOH dielectric material of this invention. The data in FIG. 9 was measured from films having the composition H 32%, C 16%, Si 22%, O 30%.

Referring to FIG. 9A, the black curve 109 is measured from a film 50 nm thick, and the gray curve 112 is from a film 37 nm thick. Both curves are from a capacitor having approximately 0.05 $cm^2$ area. Current density (per 1 $cm^2$) is then 20× higher than the current values plotted. The black curve 109 from the 50 nm film has a leakage current at 1 MV/cm field, 110, less than 1 $nA/cm^2$. Dielectric breakdown, 111, for this film is seen near 10 MV/cm applied field. The gray curve 112 from the 37 nm film has a leakage current at 1 MV/cm field, 113, of About 2 $nA/cm^2$. Dielectric breakdown, 114, for this film is seen near 11 MV/cm applied field.

FIG. 9B summarizes the Breakdown field measured on 64 capacitors for the thin film SiCOH dielectric material of this invention, and is called a Breakdown distribution plot. The black curve 115 from the 50 nm film has dielectric breakdown mainly above 10 MV/cm applied field. Some capacitors break at lower field, 116, between 8 and 10 MV/cm. the gray curve 117 from the 37 nm film has Dielectric breakdown greater than 9 MV/cm applied field, and the trend is similar to curve 115 for most of the capacitors tested.

The very high breakdown field seen in FIG. 9 for both films (50 and 37 nm) shows this material is an exceptionally stable dielectric having superior properties compared to other Low-k dielectrics. The high breakdown field and low leakage current and low dielectric constant are not expected, based on other Low-k dielectrics. These properties make the SiCOH dielectric film of FIG. 9 very well suited for use in many electronic structures, for example the transformer of FIG. 3 and the interconect structure of FIG. 6.

Commonly, the desirable bulk properties of the SiCOH dielectric may lead to poor adhesion at an interface, or the film may be chemically changed by a process step when fabricating the inventive structures. To solve these problems, use of layers that contain little or no Carbon is recommended. Said layers have the properties of deposited SiOxide which is a common material in the art. Then, a graded composition layer of the SiCOH dielectric material may be used according to this invention. Two examples of a graded composition layer of the SiCOH dielectric material are shown in FIG. 10.

Figure 10A:
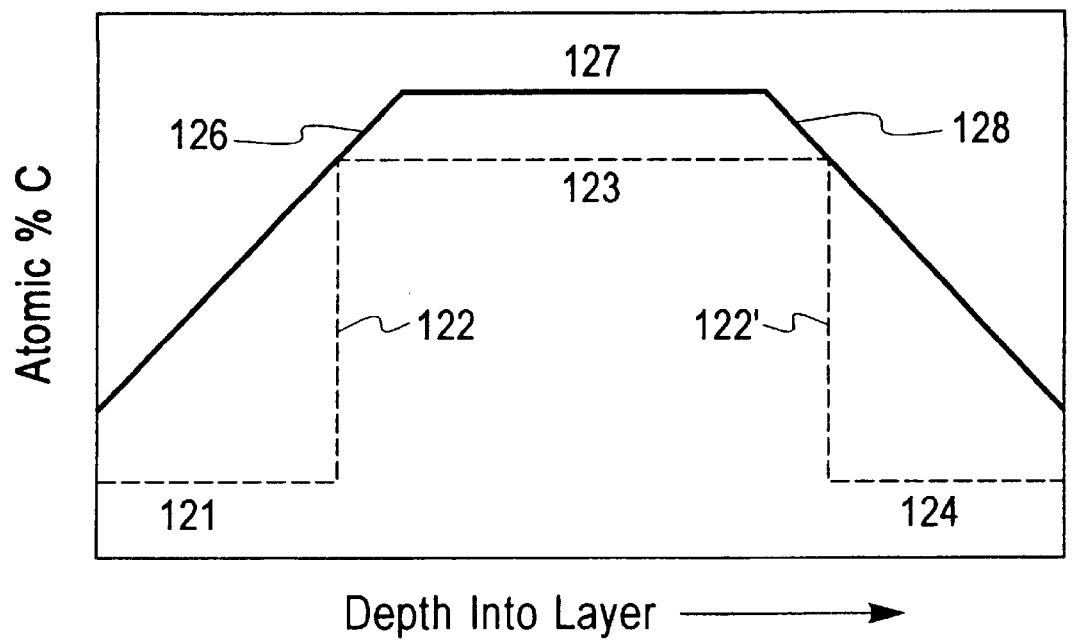
FIGS. 10A and 10B are graphs of the carbon content versus depth in a layer of low k SiCOH dielectric of the invention.

FIG. 10A illustrates the first graded Carbon layer of the SiCOH dielectric material of this invention, in which 3 different carbon contents may be used in different zones of a dielectric layer. FIG. 10A is a plot of the atomic percent Carbon in the SiCOH dielectric versus depth into the dielectric layer. The dashed line shows one implementation of the first graded Carbon layer of this invention, said dashed line marking 3 distinct zones (121, 123, 124) of the SiCOH dielectric film according to the invention. Region 121 is a low Carbon zone having properties similar to Si Oxide near the surface of the layer (near zero depth). Region 122 is an abrupt transition region to the typical SiCOH composition, region 123, according to the invention. Region 123 has the atomic composition and properties given above in the Examples using the SiCOH dielectric. Region 122' is a second abrupt transition region, to a low Carbon region, 124, which also has properties similar to Si Oxide. In FIG. 10A, the solid line shows a second implementation of the first graded Carbon layer of this invention, said solid line marking 3 distinct zones (126, 127, 128) of the SiCOH dielectric film according to the invention, with a continuous change in carbon content. Region 126 is a zone near the surface of the layer (near zero depth) in which the carbon concentration changes from low to high. The typical SiCOH composition (carbon content) is shown as region 127, according to the invention. Region 127 has the atomic composition and properties given above in Examples 1–7. Region 128 is a zone near the bottom interface of the layer in which the carbon concentration changes from high to low.

Figure 10B:
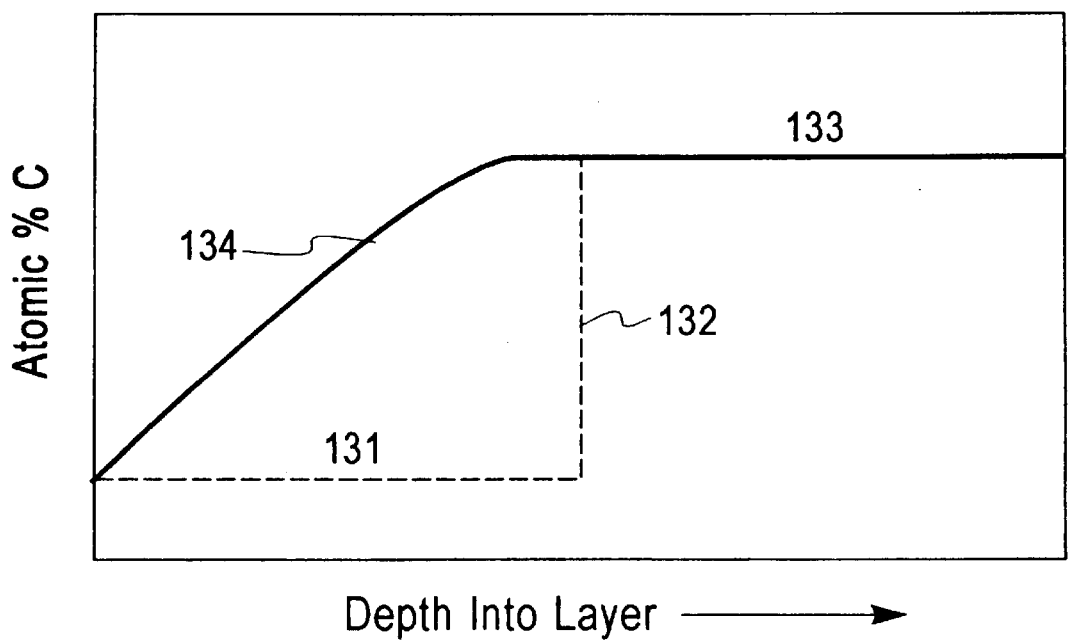

FIG. 10B illustrates the second graded Carbon layer of the SiCOH dielectric material of this invention, in which 2 different carbon contents may be used in two zones of a dielectric layer. FIG. 10B is a plot of the atomic percent Carbon in the SiCOH dielectric versus depth into the dielectric layer. The dashed line shows one implementation of the second graded Carbon layer of this invention, said dashed line marking 2 distinct zones (131, 133,) of the SiCOH dielectric film according to the invention. Region 131 is a low Carbon zone near the surface of the layer (near zero depth), said zone having properties similar to Si Oxide. Region 132 is an abrupt transition region to the typical SiCOH composition, region 133, according to the invention. Region 133 has the atomic composition and properties given above in Examples 1–7.

In FIG. 10B, the solid line shows a second implementation of the second graded carbon layer of this invention, marking 2 distinct zones (134, 133) of the SiCOH dielectric film according to the invention, with a continuous change in carbon content. Region 134 is a zone near the surface of the layer (near zero depth) in which the carbon concentration changes from low to high. The typical SiCOH composition (carbon content) is shown as region 133, according to the invention. Region 133 has the atomic composition and properties given above in Examples 1–7. Region 131 or 134 (low carbon concentration) has a low carbon content, a high density, and hence superior air barrier properties for protection against oxidation compared to (zone 133) the SiCOH material.

Capacitor, inductor and transformer structures of this invention have been described in detail. As would be known by one skilled in the art, thin film resistor structures may also be separated from a substrate by a layer of the SiCOH dielectric material. These structures have a reduced parasitic capacitance compared to prior art thin film resistor structures, and are within the scope of this invention. Other structures may be made using the SiCOH dielectric to isolate the structure from the substrate with this invention, reducing parasitic capacitance and hence increasing the frequency of operation. Also, this material is an effective protection (passivation) layer against air oxidation. The high breakdown field and low leakage current and low dielectric constant and air barrier properties of the SiCOH dielectric material are a new unexpected combination of properties.

While there has been described and illustrated a low k structure containing a dielectric of SiCOH, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An inductor structure comprising:
   a substrate having a first surface,
   a first layer of SiCOH dielectric material formed atop said first surface, said first SiCOH dielectric layer having a second surface,
   a patterned conductor structure atop said second surface of said first SiCOH dielectric layer, and
   a second layer of SiCOH dielectric material atop said first SiCOH dielectric layer, covering and surrounding said patterned conductor structure.

2. The structure of claim 1 wherein said SiCOH dielectric material includes Si, C, O, and H wherein the composition H is in the range from 10 to 55 at %, C is in the range from 5 to 45 at %, Si is in the range from 5 to 40 at %, and O is in the range from 0 to 50 at %.

3. The structure of claim 1 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

4. The structure of claim 1 wherein said SiCOH dielectric material includes Si, C, and H without Oxygen, and may contain an additive selected from the group consisting of N, F, and Ge.

5. The structure of claim 1 wherein said SiCOH dielectric material has a dielectric constant of less than 3.5.

6. The structure of claim 1 wherein said SiCOH dielectric material has a breakdown field of greater than 4.5 MV/cm.

7. The structure of claim 1 wherein said SiCOH dielectric material has a leakage current at I MV/cm applied field of less than 10 nanoAmps per $cm^2$.

8. The structure of claim 1 wherein said patterned conductor structure has a spiral shape selected from the group consisting of round in the plane of said spiral and square in the plane of said spiral.

9. The structure of claim 1 wherein said patterned conductor structure has a toroidal shape.

10. A membrane inductor structure comprising:
a first layer of SiCOH dielectric having a top surface and being supported underneath only at edges thereof,
a conductor layer patterned into a spiral shape atop said top surface of said dielectric, and
a second layer of SiCOH dielectric atop said first SiCOH dielectric layer, covering and surrounding said patterned conductor structure.

11. The structure of claim 10 wherein said SiCOH dielectric material includes Si, C, O, and H wherein the composition H is in the range from 10 to 55 at %, C is in the range from 5 to 45 at %, Si is in the range from 5 to 40 at %, and O is in the range from 0 to 50 at %.

12. The structure of claim 10 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

13. The structure of claim 10 wherein said SiCOH dielectric material includes Si, C, and H without Oxygen, and may contain an additive selected from the group consisting of N, F, and Ge.

14. The structure of claim 10 wherein said SiCOH dielectric material has a dielectric constant of less than 3.5.

15. The structure of claim 10 wherein said SiCOH dielectric material has a breakdown field of greater than 4.5 MV/cm.

16. A transformer structure comprising:
a substrate having a first surface,
a first conductor patterned as a first closed loop,
a layer of the SiCOH dielectric deposited atop said first conductor and said SiCOH dielectric layer having a second surface, and
a second conductor patterned in a second closed loop atop said second surface of said SiCOH dielectric.

17. The structure of claim 16 further including a permanent magnet body extending through said first and second closed conductor loops.

18. The structure of claim 16 wherein said SiCOH dielectric material includes Si, C, O, and H wherein the composition H is in the range from 10 to 55 at %, C is in the range from 5 to 45 at %, Si is in the range from 5 to 40 at %, and O is in the range from 0 to 50 at %.

19. The structure of claim 16 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

20. The structure of claim 16 wherein said SiCOH dielectric material includes Si, C, and H without Oxygen, and may contain an additive selected from the group Consisting Of N, F, and Ge.

21. The structure of claim 16 wherein said SiCOH dielectric material has a dielectric constant of less than 3.5.

22. Interconnect structure: on an integrated circuit, the structure of claim 21, said top surface of said patterned metal conductors and said top surface of said mask patterning/CMP stop layer being in intimate contact with a diffusion barrier layer comprised of Si, C, H or Si, N, C, H, and optionally containing oxygen.

23. The structure of claim 16 wherein said SiCOH dielectric material has a breakdown field of greater than 4.5 MV/cm.

24. A circuit board structure comprising an insulating substrate,
a plurality of patterned metal conductors formed in a first conductor layer on said insulating substrate,
a layer of the thick SiCOH dielectric having a thickness greater than 0.5 microns, formed atop said first conductor layer,
a plurality of patterned metal connectors formed within said thick SiCOH dielectric layer,
a plurality of patterned metal conductors formed in a second conductor layer atop said thick SiCOH dielectric,
said first and second conductor layers being electrically connected at selected locations by said patterned metal connectors.

25. The circuit board structure of claim 24, further including a second insulating substrate adjacent to said second conductor layer.

26. The circuit board structure of claim 24 in which said first conductor layer is surrounded by said SiCOH dielectric material.

27. The structure of claim 24 wherein said SiCOH dielectric material includes Si, C, O, and H wherein the composition H is in the range from 10 to 55 at %, C is in the range from S to 45 at %, Si is in the range from 5 to 40 at %, and O is in the range from 0 to 50 at %.

28. The structure of claim 24 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

29. The structure of claim 24 wherein said SiCOH dielectric material includes Si, C, and H without Oxygen, and may contain an additive selected from the group consisting of N, F, and Ge.

30. The structure of claim 24 wherein said SiCOH dielectric material has a dielectric constant of less than 3.5.

31. The structure of claim 24 wherein said SiCOH dielectric material has a breakdown field of greater than 4.5 MV/cm.

32. A circuit board structure comprising more than one substructure in which said substructure further includes a plurality of patterned metal conductors formed in a first conductor layer on a first insulating substrate,
a layer of the thick SiCOH dielectric having a thickness greater than 0.5 microns, formed atop said first conductor layer,
a plurality of patterned metal connectors formed within said thick SiCOH dielectric layer,
a plurality of patterned metal conductors formed in a second conductor layer atop said thick SiCOH dielectric,
said first and second conductor layers being electrically connected at selected locations by said patterned metal connectors.

33. The circuit board structure of claim 24 in which said first conductor layer is surrounded by a dielectric material of any composition.

34. Interconnect structure:
on an integrated circuit, a plurality of patterned metal conductors formed within an organic thermoset dielectric material,
said conductors having a top surface,
said conductors surrounded by a conductive diffusion barrier liner 1 to 10 nm thick,
said conductive diffusion barrier liner being on all sides except said top surface of said conductors,
and with mask patterning/CMP stop layer atop said organic dielectric material, said mask patterning/CMP stop layer comprised of the SiCOH dielectric material, and said mask patterning/CMP stop layer having a top surface that is approximately co-planar with the top surface of said patterned metal conductors.

35. The structure of claim 34 wherein said SiCOH dielectric material includes Si, C, O, and H wherein the composition H is in the range from 10 to 55 at %, C is in the range from 5 to 45 at %, Si is in the range from 5 to 40 at %, and O is in the range from 0 to 50 at %.

36. The structure of claim 34 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

37. The structure of claim 34 wherein said SiCOH dielectric material includes Si, C, and H without Oxygen, and may contain an additive selected from the group consisting of N, F, and Ge.

38. The structure of claim 34 wherein said SiCOH dielectric material has a dielectric constant of less than 3.5.

39. The structure of claim 34 wherein said SiCOH dielectric material has a breakdown field of greater than 4.5 MV/cm.

40. A capacitor structure comprised of a substrate having a first surface, a layer of the SiCOH dielectric deposited atop said first surface and said SiCOH dielectric layer having a second surface, and a patterned conductor layer atop said second surface of said SiCOH dielectric, said conductor layer comprised of a first electrode region and a second electrode region, said first and second electrodes being electrically isolated and being separated by a capacitor dielectric.

41. The capacitor structure of claim 40 further including a second layer of the SiCOH dielectric atop said conductor layer and atop said capacitor dielectric (for passivation/air protection).

42. On an integrated circuit, the structure of claim 40 wherein at least 1 of the 2 electrodes is a region of a patterned metal interconnect level of a said IC.

43. The structure of claim 40 wherein said SiCOH dielectric material includes Si, C, O, and H wherein the composition H is in the range from 10 to 55 at %, C is in the range from 5 to 45 at O/o Si is in the range from 5 to 40 at %, and O is in the range from 0 to 50 at %.

44. The structure of claim 40 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

45. The structure of claim 40 wherein said SiCOH dielectric material includes Si, C, and H without Oxygen, and may contain an additive selected from the group consisting of N, F, and Ge.

46. The structure of claim 40 wherein said SiCOH dielectric material has a dielectric constant of less than 3.5.

47. The structure of claim 40 wherein said SiCOH dielectric material has a breakdown field of greater than 4.5 MV/cm.

48. An interconnect structure on an integrated circuit comprising:

a plurality of patterned metal conductors formed within a dielectric material, said conductors having a top surface, said conductors surrounded by a conductive diffusion barrier liner 1 to 10 nm thick, said conductive diffusion barrier liner being on all sides except said top surface of said conductors, and a mask patterning/CMP stop layer atop said dielectric material, said mask patterning/CMP stop layer comprising said SiCOH dielectric material, and said mask patterning/CM P stop layer having a top surface that is substantially co-planar with the top surface of said patterned metal conductors.

49. The structure of claim 48 wherein said dielectric material is an organic polymeric thermoset dielectric.

50. The structure of claim 48 wherein the dielectric material is an organic polymeric thermoset dielectric has porosity wherein said porosity means voids with a dimension across the void in the range from 1 to 50 nm.

51. The structure of claim 48, wherein said SiCOH dielectric material includes Si, C, O, and H wherein the composition H is in the range from 10 to 55 at %, C is in the range from 5 to 45 at %, Si is in the range from 5 to 40 at %, and O is in the range from 0 to 50 at %.

52. The structure of claim 48 wherein said SiCOH dielectric material includes Si, C, O, and H wherein the composition H is in the range from 25 to 55 at %, C is in the range from 10 to 40 at %, Si is in the range from 10 to 30 at %, and O is in the range from 10 to 35 at %.

53. The structure of claim 48 wherein said SiCOH dielectric material includes Si, C, and ii without Oxygen, and may contain an additive selected from the group consisting of N, F, and Ge.

54. The structure of claim 48 wherein said SiCOH dielectric material has a dielectric constant of less than 3.5.

55. The structure of claim 48 wherein said SiCOH dielectric material has a breakdown field of greater than 4.5 MV/cm.

* * * * *

UNITED STATES PATENT AND TRADEMARK OFFICE
CERTIFICATE OF CORRECTION

PATENT NO. : 6,737,727 B2
DATED : May 18, 2004
INVENTOR(S) : Stephen M. Gates

It is certified that error appears in the above-identified patent and that said Letters Patent is hereby corrected as shown below:

Column 11,
Line 54, "Consisting OF N" should read -- consisting of N --

Column 12,
Line 23, "S" should read -- 5 --

Column 13,
Line 42, "at O/o" should read -- at % --

Column 14,
Line 43, "ii" should read -- H --

Signed and Sealed this

Twenty-first Day of June, 2005

JON W. DUDAS
*Director of the United States Patent and Trademark Office*